United States Patent
Tsai et al.

(10) Patent No.: US 9,865,531 B2
(45) Date of Patent: Jan. 9, 2018

(54) POWER MODULE PACKAGE HAVING PATTERNED INSULATION METAL SUBSTRATE

(71) Applicant: Delta Electronics, Inc., Taoyuan (TW)

(72) Inventors: Hsin-Chang Tsai, Taoyuan (TW); Chia-Yen Lee, Taoyuan (TW); Peng-Hsin Lee, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 0 days.

(21) Appl. No.: 15/142,588

(22) Filed: Apr. 29, 2016

(65) Prior Publication Data

US 2017/0317014 A1    Nov. 2, 2017

(51) Int. Cl.
*H01L 23/495* (2006.01)
*H01L 23/00* (2006.01)
*H01L 21/48* (2006.01)

(52) U.S. Cl.
CPC .... *H01L 23/49575* (2013.01); *H01L 21/4825* (2013.01); *H01L 21/4839* (2013.01); *H01L 23/49548* (2013.01); *H01L 23/49586* (2013.01); *H01L 24/49* (2013.01); *H01L 2224/48091* (2013.01); *H01L 2924/01007* (2013.01); *H01L 2924/01029* (2013.01); *H01L 2924/01031* (2013.01); *H01L 2924/13064* (2013.01)

(58) Field of Classification Search
CPC ......... H01L 23/49575; H01L 23/49548; H01L 24/49; H01L 21/4825
USPC ............................................ 257/676
See application file for complete search history.

(56) References Cited

U.S. PATENT DOCUMENTS

| | | | |
|---|---|---|---|
| 2008/0191325 A1* | 8/2008 | Shirasaka | H01L 23/3107 257/666 |
| 2009/0001554 A1* | 1/2009 | Otremba | H01L 24/33 257/708 |
| 2013/0154123 A1* | 6/2013 | Poh | H01L 23/49575 257/782 |

* cited by examiner

*Primary Examiner* — Theresa T Doan
(74) *Attorney, Agent, or Firm* — Muncy, Geissler, Olds & Lowe, P.C.

(57) ABSTRACT

A power module package is provided, including a substrate, a first chip, and a second chip. The substrate includes a metal carrier, a patterned insulation layer disposed on the metal carrier and partially covering the metal carrier, and a patterned conductive layer disposed on the patterned insulation layer. The first chip is disposed on the metal carrier not covered by the patterned insulation layer. The second chip is disposed on the patterned conductive layer and electrically connected to the first chip.

14 Claims, 10 Drawing Sheets

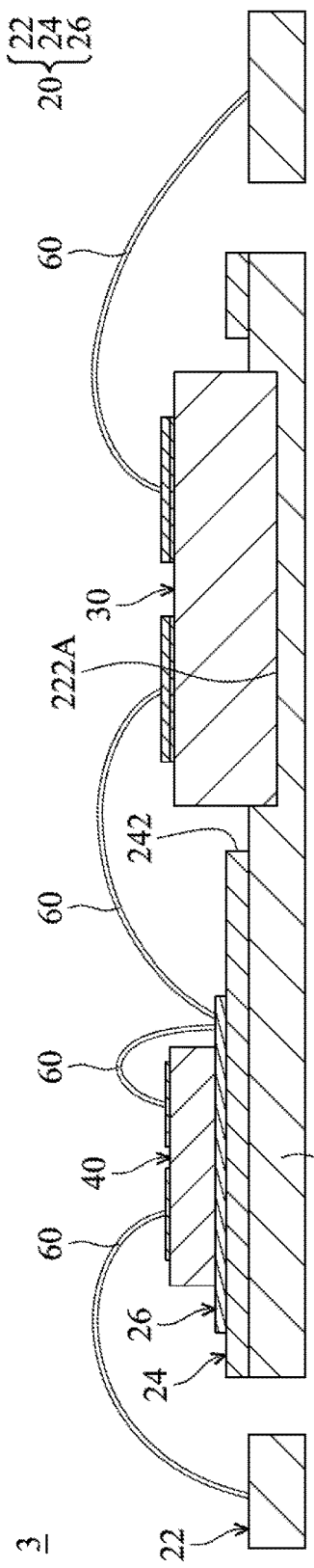
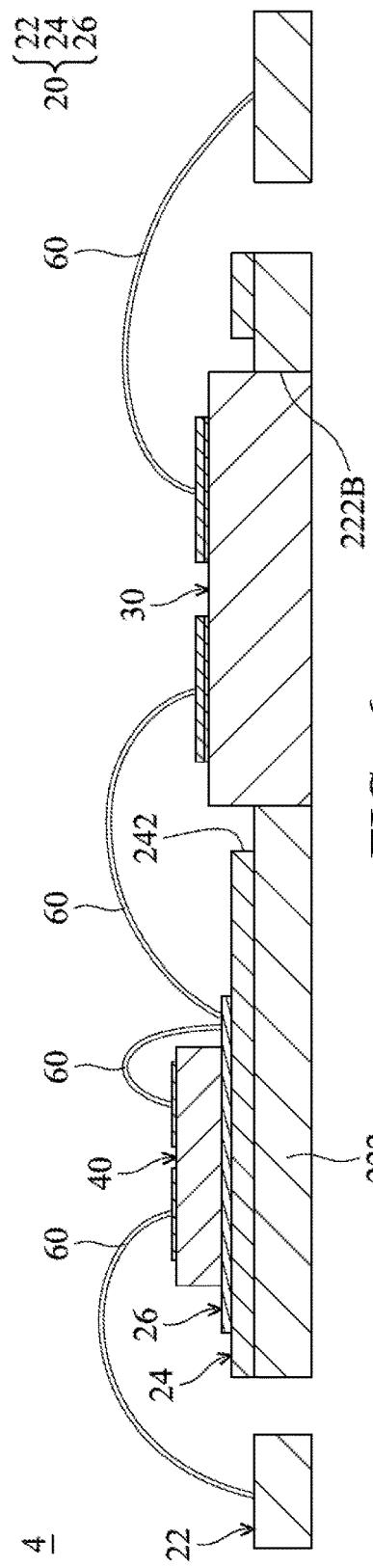
FIG. 5
FIG. 6

POWER MODULE PACKAGE HAVING PATTERNED INSULATION METAL SUBSTRATE

BACKGROUND OF THE INVENTION

Field of the Invention

The present application relates to a semiconductor package, and in particular to a power module package having a patterned insulation metal substrate (PIMS).

Description of the Related Art

Power module packages have been widely applied in automobiles, industrial equipment, and household electrical appliances. In general, in power module packages, one or more semiconductor power chips are mounted on a metal carrier and encapsulated with an epoxy molding compound (EMC) to protect internal parts.

FIG. 1 shows a schematic cross-sectional view of a traditional power module package 1. The traditional power module package 1 primarily includes a metal carrier 10, a full-faced insulation layer 11 on the metal carrier 10, a patterned conductive layer 12 on the insulation layer 11 (the metal carrier 10, the insulation layer 11, and the conductive layer 12 compose a metal substrate of the traditional power module package 1), and a plurality of power chips 13 which are electrically connected to the parts of the conductive layer 12 and which are electrically connected to each other via a plurality of wires 14.

However, owing to the aforementioned structural feature of the substrate (the metal carrier 10, the insulation layer 11, and the conductive layer 12 are stacked on each other), the traditional power module package 1 usually has a poor ability to dissipate heat. Consequently, the reliability of the traditional power module package 1 is adversely affected.

BRIEF SUMMARY OF THE INVENTION

In view of the aforementioned problems, an embodiment of the invention provides a substrate (a patterned insulation metal substrate (PIMS)), comprising a metal carrier, a patterned insulation layer, and a patterned conductive layer. The patterned insulation layer is disposed on the metal carrier and partially covers the metal carrier. The patterned conductive layer is disposed on the patterned insulation layer.

Another embodiment of the invention provides a power module package, comprising a substrate (a patterned insulation metal substrate (PIMS)), a first chip, and a second chip. The substrate includes a metal carrier, a patterned insulation layer disposed on the metal carrier and partially covering the metal carrier, and a patterned conductive layer disposed on the patterned insulation layer. The first chip is disposed on the metal carrier not covered by the patterned insulation layer. The second chip is disposed on the patterned conductive layer and is electrically connected to the first chip.

Another embodiment of the invention provides a method of manufacturing a patterned insulation metal substrate, comprising: providing a substrate including an insulation layer and a patterned conductive layer covering a top surface of the insulation layer; forming an adhesive side on a bottom surface of the insulation layer; forming an opening through the insulation layer; and laminating a patterned metal carrier to the adhesive side of the insulation layer.

Another embodiment of the invention provides a method of manufacturing a patterned insulation metal substrate, comprising: providing a substrate including an insulation layer and a patterned conductive layer covering a top surface of the insulation layer; forming an adhesive side on a bottom surface of the insulation layer; forming an opening through the insulation layer; laminating a metal carrier to the adhesive side of the insulation layer; and patterning the metal carrier.

BRIEF DESCRIPTION OF THE DRAWINGS

The invention can be more fully understood by reading the subsequent detailed description and examples with references made to the accompanying drawings, wherein:

FIG. 5 is a schematic cross-sectional view of a power module package in accordance with another embodiment of the invention;

FIG. 6 is a schematic cross-sectional view of a power module package in accordance with another embodiment of the invention;

DETAILED DESCRIPTION OF THE INVENTION

Figure 1:
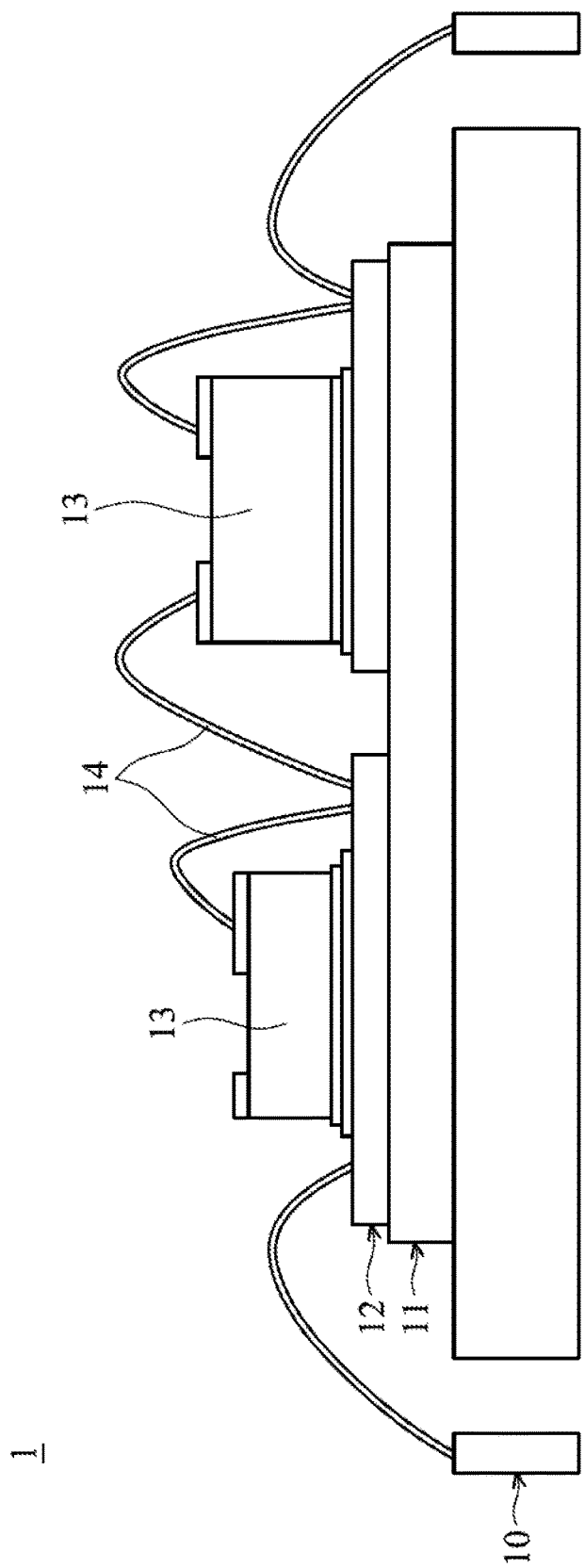
FIG. 1 is a schematic cross-sectional view of a traditional power module package.

In order to illustrate the purposes, features, and advantages of the invention, the preferred embodiments and drawings of the invention are shown in detail as follows.

In the following detailed description, the orientations of "on", "above", "under", and "below" are used for representing the relationship between the relative positions of each element as illustrated in the drawings, and are not meant to limit the invention.

In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity. Furthermore, some elements not shown or described in the embodiments have the forms known by persons skilled in the field of the invention.

Figure 2:
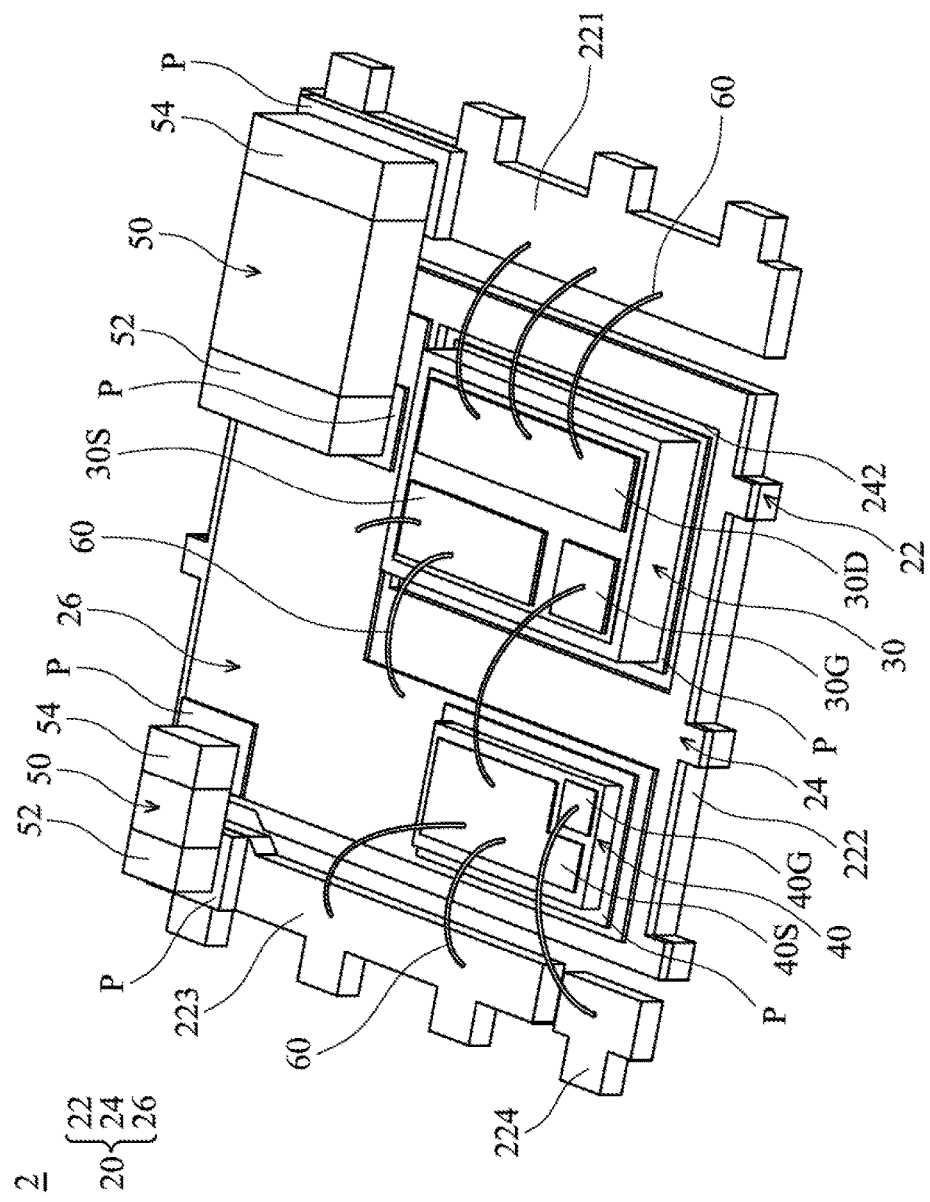
FIG. 2 is a schematic perspective view of a power module package in accordance with an embodiment of the invention.
Figure 3:
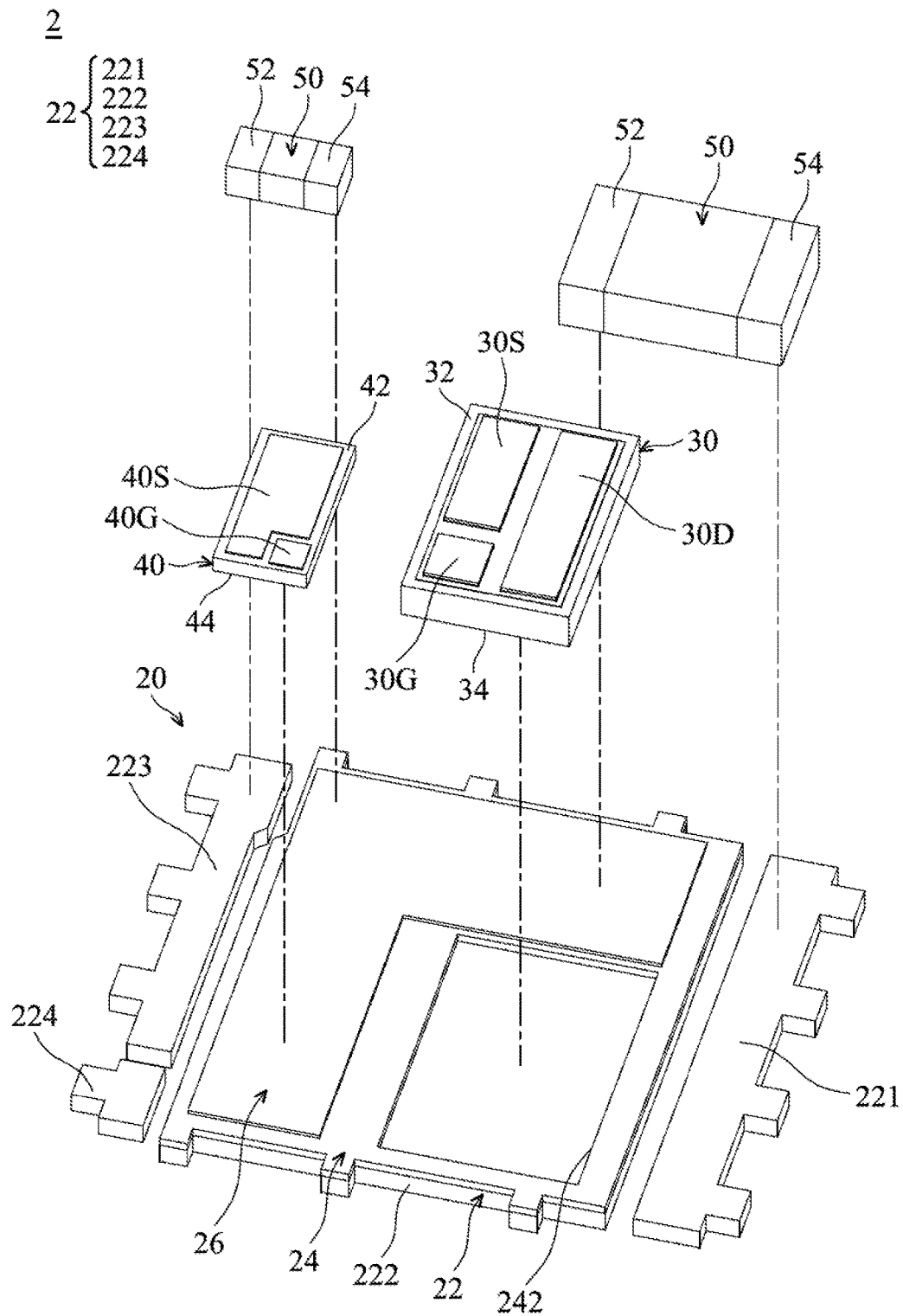
FIG. 3 is an exploded view of the power module package in FIG. 2.
Figure 4:
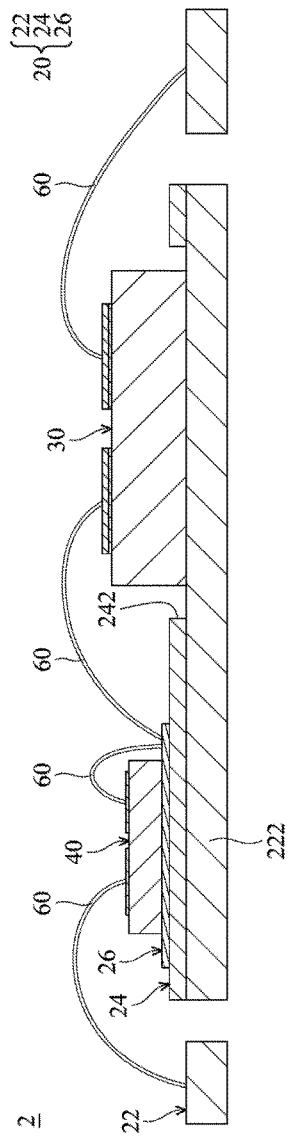
FIG. 4 is a schematic cross-sectional view of the power module package in FIG. 2.

Refer to FIGS. 2~4, wherein FIG. 2 is a schematic perspective view of a power module package 2 in accordance with an embodiment of the invention, FIG. 3 is an exploded view of the power module package 2 in FIG. 2, and FIG. 4 is a schematic cross-sectional view of the power module package 2 in FIG. 2. The power module package 2 in accordance with an embodiment of the invention includes a patterned insulation metal substrate (PIMS) 20, a first semiconductor power chip 30, a second semiconductor power chip 40, two passive components 50, and a plurality of wires 60. It should be realized that an encapsulation layer, such as an epoxy molding compound (EMC) covering the first semiconductor power chip 30, the second semiconductor power chip 40, the passive components 50, and the wires 60 on the patterned insulation metal substrate 20, is omitted in FIGS. 2~4.

As shown in FIGS. 2~4, the patterned insulation metal substrate 20 includes a carrier 22, an insulation layer 24, and a conductive layer 26. In this embodiment, the carrier 22 is a lead frame including several patterned and separated parts. Specifically, the carrier 22 is made of metal (e.g. copper) and includes a first part 221, a second part 222, a third part 223, and a fourth part 224. The insulation layer 24 may comprise fiberglass, epoxy fiberglass, epoxies, silicones, urethanes, or acrylates which could add aluminum oxide, boron nitride, zinc oxide or aluminum nitride as fillers to increase thermal conductivity, and is formed on the carrier 22. It should be noted that the insulation layer 24 is a patterned insulation layer which partially covers the second part 222 of the metal carrier 22. In this embodiment, the patterned insulation layer 24 has at least one opening 242 such that at least one part of the second part 222 of the metal carrier 22 is exposed. Moreover, the conductive layer 26 is also made of metal (e.g. copper), and is formed on the insulation layer 24. It should be noted that the conductive layer 26 is a patterned conductive layer which partially covers the insulation layer 24. In this embodiment, the patterned conductive layer 26 is L-shaped, adjacent to the edges of the insulation layer 24, and partially surrounds the opening 242 of the insulation layer 24 (see FIG. 3), but the invention is not limited thereto.

As shown in FIGS. 2~4, the first semiconductor power chip 30 is disposed on the second part 222 of the metal carrier 22 not covered by the insulation layer 24. More specifically, the first semiconductor power chip 30 is disposed in the opening 242 of the insulation layer 24 and directly connected to the metal carrier 22. Thus, the heat generated from the first semiconductor power chip 30 can be effectively dissipated through a bottom surface (not covered by the insulation layer 24) of the metal carrier 22. Conversely, in the traditional power module package 1 illustrated in FIG. 1, the heat generated from the power chips 13 cannot be effectively dissipated through the metal carrier 10 due to blocking from the full-faced insulation layer 11. Therefore, with the design of the patterned insulation layer 24, the power module package 2 of this embodiment can have a better heat dissipation ability, thereby having an improved reliability.

As shown in FIGS. 2~4, the second semiconductor power chip 40 is disposed on the conductive layer 26. In addition, the first and second semiconductor power chips 30 and 40 can be mounted on the metal carrier 22 and the conductive layer 26, respectively, by an interface material P, and the interface material P may comprise metal alloy, solder paste, silver adhesive, or other conductive adhesive.

In this embodiment, the first semiconductor power chip 30 such as a High-Voltage (HV) switch is a lateral semiconductor component, and the second semiconductor power chip 40 such as a Low-Voltage (LV) switch is a vertical semiconductor component.

As shown in FIG. 2 and FIG. 3, the first semiconductor power chip 30 has an active side (i.e. a top surface 32A) with electrodes (comprising a first drain pad 30D, a first source pad 30S, and a first gate pad 30G) thereon and a bottom side (i.e. a bottom surface 32B) opposite to the active side, and the first semiconductor power chip 30 is disposed on the metal carrier 22 via the bottom side. It should be noted that the second part 222 of the metal carrier 22 is not electrically connected to the first semiconductor power chip 30 (a lateral semiconductor component), and has merely the same electric properties as the bottom side of the first semiconductor power chip 30. Accordingly, the bottom surface of the second part 222 of the metal carrier 22 can be directly exposed to the outside environment, thereby facilitating good heat dissipation, and having no need to be covered by an insulation layer for insulation concerns. In addition, the second semiconductor power chip 40 has a top surface 42 with electrodes (comprising a second source pad 40S and a second gate pad 40G) thereon and a bottom surface 44, opposite to the top surface 42, with an electrode (a second drain pad (not shown)) thereon, and the second semiconductor power chip 40 is disposed on the conductive layer 26 via the bottom surface 44.

As shown in FIG. 2, in this embodiment, the first drain pad 30D of the first semiconductor power chip 30 is electrically connected to the first part 211 of the metal carrier 22 via at least one of the wires 60, the first source pad 30S is electrically connected to the conductive layer 26 via at least one of the wires 60, and the first gate pad 30G is electrically connected to the second source pad 40S of the second semiconductor power chip 40 via at least one of the wires 60. In addition, the second source pad 40S of the second semiconductor power chip 40 is electrically connected to the third part 223 of the metal carrier 22 via at least one of the wires 60, the second gate pad 40G is electrically connected to the fourth part 224 of the metal carrier 22 via at least one of the wires 60, and the second drain pad on the bottom surface 44 of the second semiconductor power chip 40 is electrically connected to the conductive layer 26 (i.e. it is also electrically connected to the first source pad 30S of the first semiconductor power chip 30).

Furthermore, in this embodiment, the first semiconductor power chip 30 includes a plurality of HV transistors connected in parallel (not shown in the drawings), wherein each of the HV transistors, such as a lateral type Depletion mode (D-mode) transistor has a first source electrode electrically connected to the first source pad 30S, a first drain electrode electrically connected to the first drain pad 30D, and a first gate electrode electrically connected to the first gate pad 30G. Moreover, each of the HV transistors in the first semiconductor power chip 30 is a nitride-based transistor, such as a High Electron Mobility Transistor (HEMT) comprising Gallium Nitride (GaN). In addition, in this embodiment, the second semiconductor power chip 40 includes a plurality of LV transistors connected in parallel (not shown in the drawings), wherein each of the LV transistors, such as a vertical type Enhancement mode (E-mode) transistor has a second source electrode electrically connected to the second source pad 40S, a second drain electrode electrically connected to the second drain pad, and a second gate electrode electrically connected to the second gate pad 40G. Moreover, each of the LV transistors is a silicon-based transistor.

As shown in FIG. 2 and FIG. 3, the two passive components 50 are disposed on the patterned insulation metal substrate 20. Specifically, each of the passive components 50 may be a resistor, a capacitor, or an inductor, and has a first terminal 52 and a second terminal 54. In this embodiment, one of the passive components 50 is electrically connected to the first part 221 of the metal carrier 22 and the conductive layer 26, and the other passive component 50 is electrically connected to the conductive layer 26 and the third part 223 of the metal carrier 22. In addition, the two passive components 50 can also be mounted on the patterned insulation metal substrate 20 by an interface material P, and the interface material P may comprise metal alloy, solder paste, silver adhesive, or other conductive adhesive.

With the aforementioned structural features, a cascade switch circuit including the first semiconductor power chip 30, the second semiconductor power chip 40, and the two passive components 50 can be achieved. Compared to a single switch circuit, the cascade switch circuit is better able to supply higher voltage and switch faster.

It should be noted that the power module package 2 described above can be applied to a power related product, such as a transformer or a power supply. Moreover, with the design of the patterned insulation metal substrate (PIMS) 20, the power module package 2 can have a better heat dissipation ability and improved reliability, compared with the traditional power module package 1 (FIG. 1).

In the aforementioned embodiment, although the first semiconductor power chip 30 is a lateral semiconductor component, the invention is not limited thereto. In some embodiments, the first semiconductor power chip 30 may also be a vertical semiconductor component if the bottom surface of the metal carrier 22 is covered by an insulation layer. In some embodiments, the first and second semiconductor power chips 30 and 40 may also be other active components or drivers, rather than an HV switch and an LV switch.

Next, some power module packages with different structures in accordance with various embodiments of the invention are illustrated below.

FIG. 5 illustrates a schematic cross-sectional view of a power module package 3 in accordance with another embodiment of the invention. The power module package 3 differs from the power module package 2 (FIG. 2) described above in that the second part 222 of the metal carrier 22 further includes a cavity 222A (or a recess or a slot) which is formed on the top surface thereof and which is not covered by the insulation layer 24 (i.e. formed in the opening 242), and the first semiconductor power chip 30 is disposed therein. Since the first semiconductor power chip 30 abuts the side walls and bottom surface of the cavity 222A, the heat generated from the first semiconductor power chip 30 can be transferred to the metal carrier 22 more easily and then be effectively dissipated through the metal carrier 22.

FIG. 6 illustrates a schematic cross-sectional view of a power module package 4 in accordance with another embodiment of the invention. The power module package 4 differs from the power module package 2 (FIG. 2) described above in that the second part 222 of the metal carrier 22 further includes an opening 222B which penetrates through the top and bottom surfaces thereof and which is not covered by the insulation layer 24 (i.e. formed in the opening 242), and the first semiconductor power chip 30 is disposed therein. Since the first semiconductor power chip 30 abuts the side walls of the opening 222B and is directly exposed to the outside environment from the bottom surface of the metal carrier 22, the heat generated from the first semiconductor power chip 30 can be dissipated more effectively.

Figure 7:
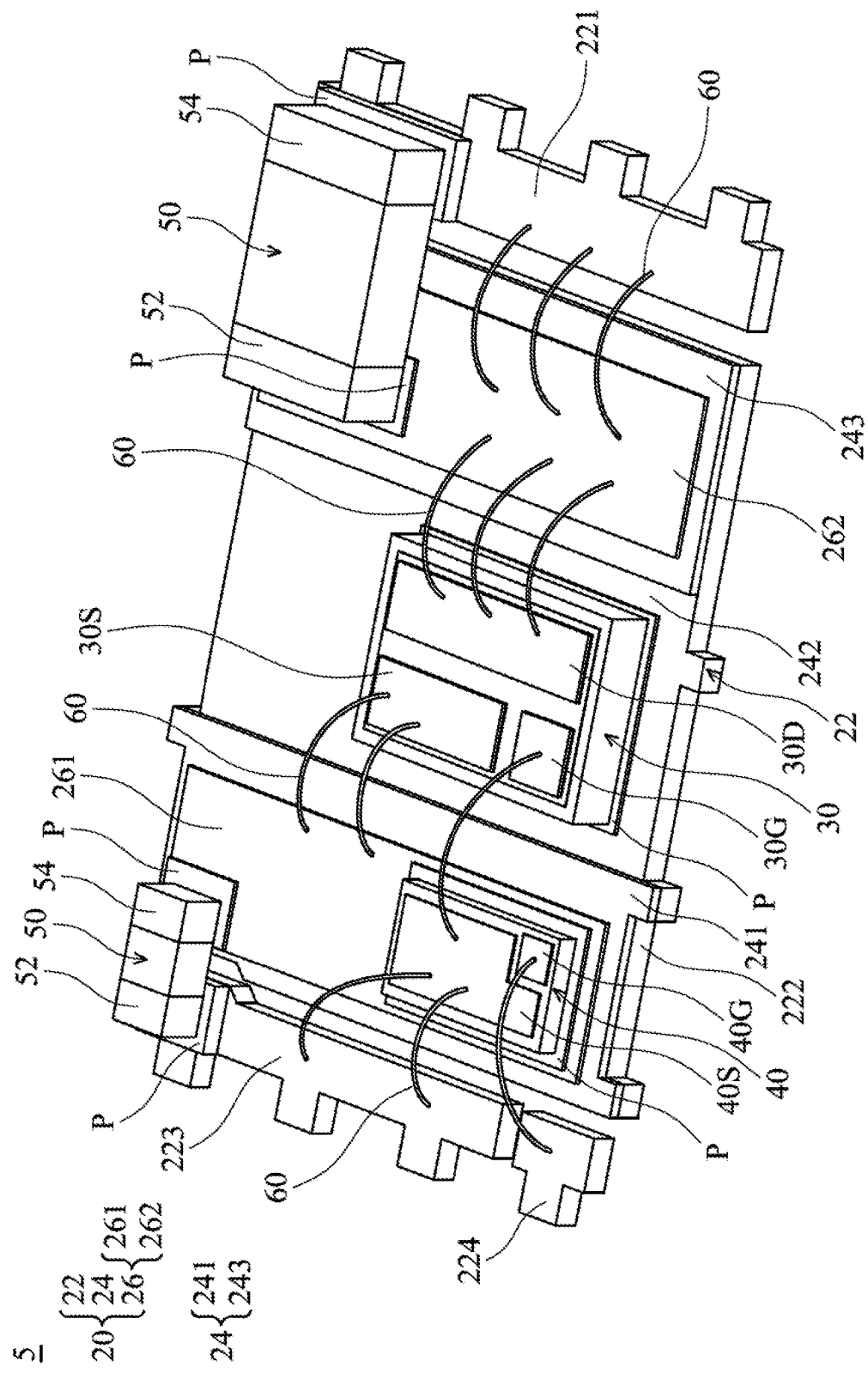
FIG. 7 is a schematic perspective view of a power module package in accordance with another embodiment of the invention.

FIG. 7 illustrates a schematic perspective view of a power module package 5 in accordance with another embodiment of the invention. The power module package 5 differs from the power module package 2 (FIG. 2) described above in that the insulation layer 24 is patterned to include a first patterned insulation portion 241 and a second patterned insulation portion 243 separated from each other. The first semiconductor power chip 30 is disposed between the first and second patterned insulation portions 241 and 243 (i.e. it is disposed in an opening 242 (an exposure area) between the first and second patterned insulation portions 241 and 243). In other words, the first and second patterned insulation portions 241 and 243 are arranged on two opposite sides of the first semiconductor power chip 30 (in contrast, the patterned insulation layer 24 in the embodiment of FIG. 2 surrounds the first semiconductor power chip 30), and the first semiconductor power chip 30 is directly connected to the second part 222 of the metal carrier 22.

In addition, in this embodiment (FIG. 7), the conductive layer 26 is patterned to include a first patterned conductive part 261 and a second patterned conductive part 262 separated from each other, and the first and second patterned conductive parts 261 and 262 are disposed on and partially cover the first and second patterned insulation portions 241 and 243, respectively. The second semiconductor power chip 40 is disposed on and electrically connected to the first patterned conductive part 261. It should also be noted that the first drain pad 30D of the first semiconductor power chip 30 in this embodiment is electrically connected to the second patterned conductive part 262 on the second patterned insulation portion 243 and then is electrically connected to the first part 221 of the metal carrier 22 via a plurality of wires 60, rather than being directly electrically connected to the first part 221 of the metal carrier 22 via at least one of the wires 60, as in the embodiment of FIG. 2.

Figure 8:
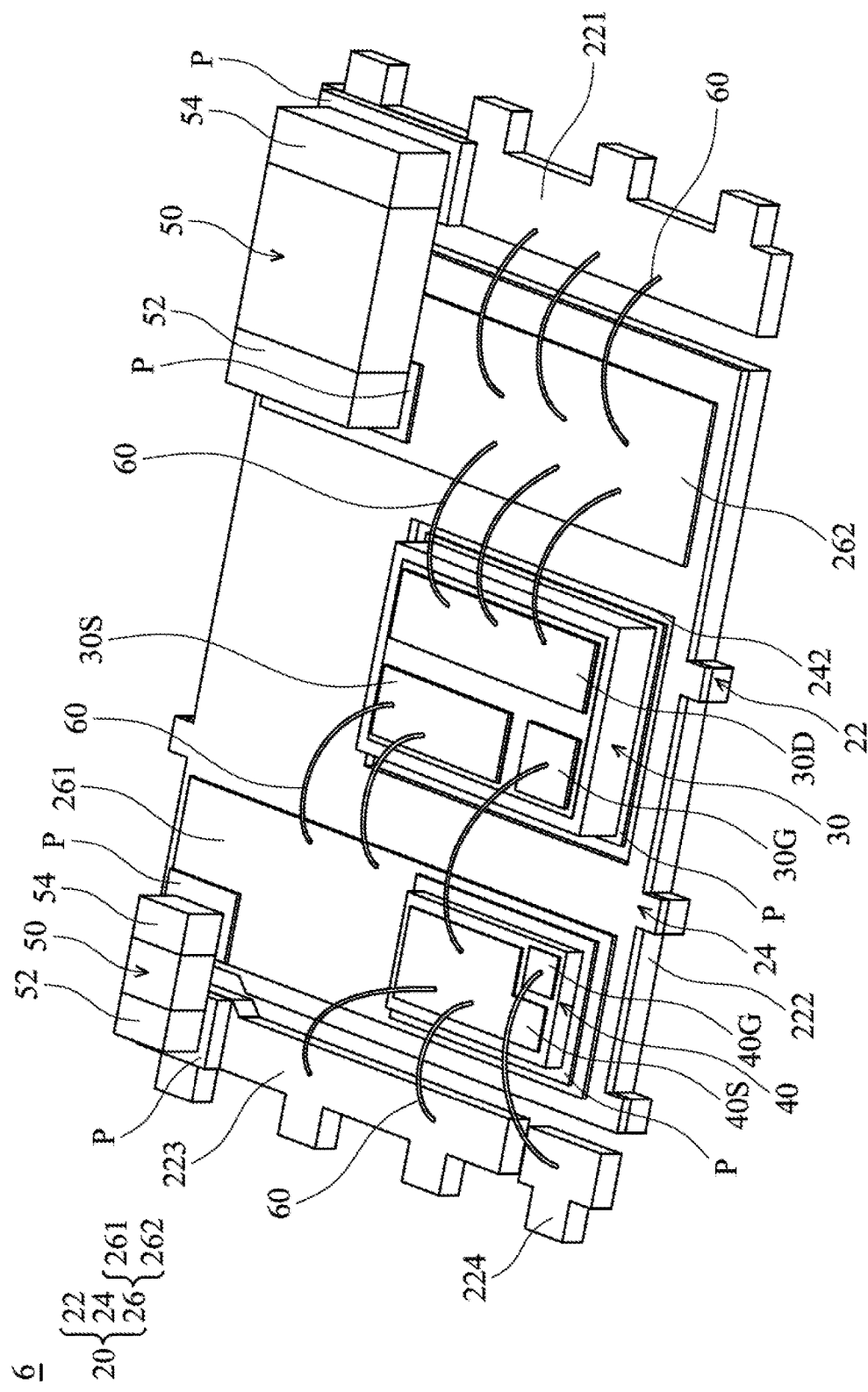
FIG. 8 is a schematic perspective view of a power module package in accordance with another embodiment of the invention.

FIG. 8 illustrates a schematic perspective view of a power module package 6 in accordance with another embodiment of the invention. The power module package 6 differs from the power module package 2 (FIG. 2) described above in that the conductive layer 26 is patterned to include a first patterned conductive part 261 and a second patterned conductive part 262 separated from each other, and the first and second patterned conductive parts 261 and 262 are arranged on two opposite sides of the first semiconductor power chip 30. The second semiconductor power chip 40 is disposed on and electrically connected to the first patterned conductive part 261. It should also be noted that, the first drain pad 30D of the first semiconductor power chip 30 in this embodiment is electrically connected to the second patterned conductive part 262 on the insulation layer 24 and then is electrically connected to the first part 221 of the metal carrier 22 via a plurality of wires 60, rather than being directly electrically connected to the first part 221 of the metal carrier 22 via at least one of the wires 60, as in the embodiment of FIG. 2.

Furthermore, although the patterned insulation layer 24 surrounds the first semiconductor power chip 30 in this embodiment (FIG. 8), it may also partially surround the first semiconductor power chip 30, that is, at least one side of the first semiconductor power chip 30 may not be surrounded by the patterned insulation layer 24.

Next, a method of manufacturing the aforementioned patterned insulation metal substrate 20 (FIGS. 2~8) in accordance with an embodiment of the invention is described above. Referring to FIGS. 9A to 9E in sequence.

Figure 9A:
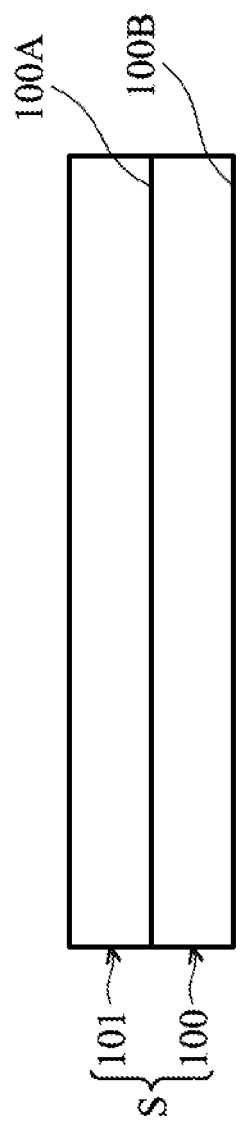
FIGS. 9A to 9E are schematic cross-sectional views illustrating a method of manufacturing a patterned insulation metal substrate of a power module package in accordance with an embodiment of the invention.
Figure 9B:
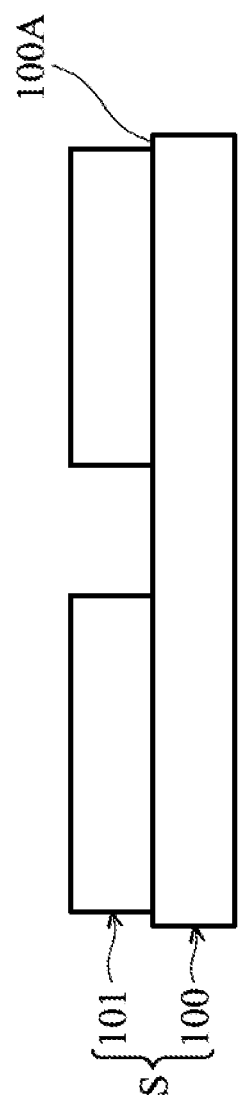

As shown in FIG. 9A, a substrate S including an insulation layer 100 and a conductive layer 101 formed on the top surface 100A of the insulation layer 100 is provided first. In this embodiment, the insulation layer 100 may comprise fiberglass epoxy fiberglass, epoxies, silicones, urethanes, or acrylates which could add aluminum oxide, boron nitride, zinc oxide or aluminum nitride as fillers to increase thermal conductivity, and the conductive layer 101 may comprise metal (e.g. copper). Then, as shown in FIG. 9B, a photolithography process (comprising steps of exposure, developing, and etching etc.) is performed so that the conductive layer 101 on the insulation layer 100 is patterned.

Figure 9C:
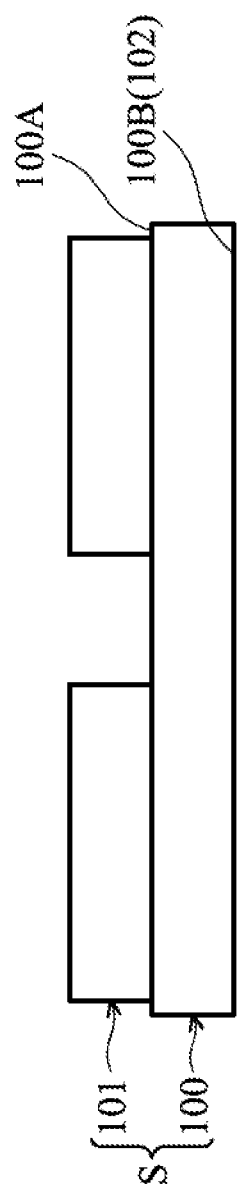
Figure 9D:
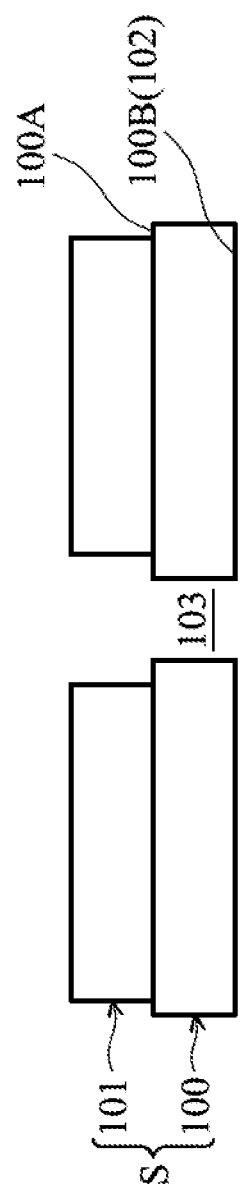

As shown in FIG. 9C, after the conductive layer 101 is patterned, an adhesive side 102 is formed on the bottom surface 100B of the insulation layer 100. In this embodiment, the adhesive side 102 is formed by applying a double-sided adhesive to the bottom surface 100B of the insulation layer 100. Then, as shown in FIG. 9D, a drill processing such as laser or mechanical drilling is performed to form at least one opening 103 through the insulation layer 100. It should be realized that the patterned conductive layer 101, the insulation layer 100 after the drill processing, and the opening 103 correspond to the patterned conductive layer 26, the patterned insulation layer 24, and the opening 242, respectively, of the aforementioned patterned insulation metal substrate 20 (FIGS. 2~8).

Figure 9E:
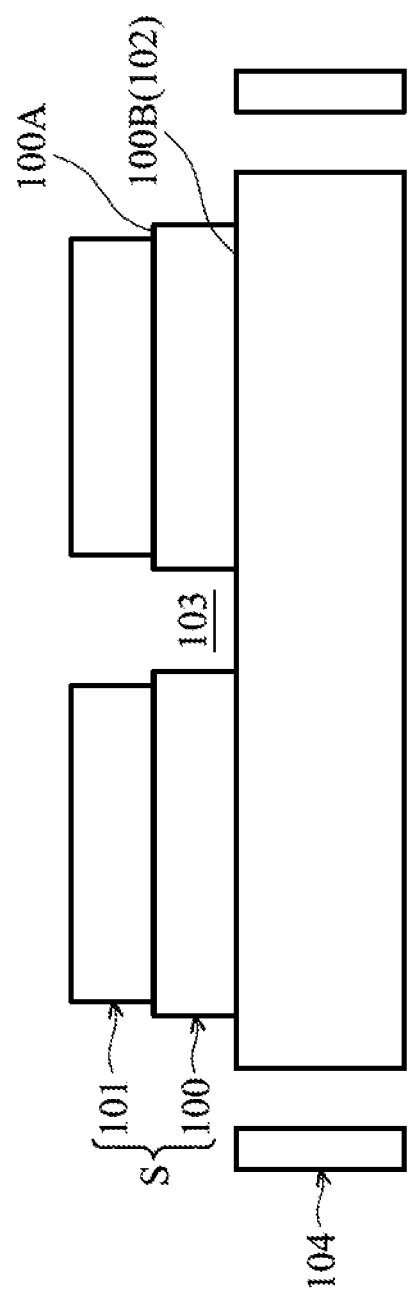

As shown in FIG. 9E, after the opening 103 through the insulation layer 100 is formed, a patterned metal carrier 104 such as a lead frame is provided, and then the patterned metal carrier 104 is laminated to the adhesive side 102 of the insulation layer 100. The metal carrier 104 corresponds to the metal carrier 22 of the aforementioned patterned insulation metal substrate 20 (FIGS. 2~8). Consequently, the fabrication of a patterned insulation metal substrate which includes a metal carrier, a patterned insulation layer disposed on the metal carrier and partially covering the metal carrier, and a patterned conductive layer disposed on the patterned insulation layer is completed.

It should also be realized that, in some embodiments, after the opening 103 through the insulation layer 100 is formed (FIG. 9D), a non-patterned metal carrier 104 can be laminated to the adhesive side 102 of the insulation layer 100 firstly, and then the non-patterned metal carrier 104 is patterned (FIG. 9E) by, for example, laser drilling or photolithography process (comprising steps of exposure, developing, and etching etc.), so as to complete the fabrication of a patterned insulation metal substrate which includes a metal carrier, a patterned insulation layer disposed on the metal carrier and partially covering the metal carrier, and a patterned conductive layer disposed on the patterned insulation layer.

As mentioned above, the invention provides a power module package having a patterned insulation metal substrate (PIMS). Since the patterned insulation layer in the PIMS will not block the heat generated from the semiconductor power chips mounted on the PIMS, the power module package can have a better heat dissipation ability and improved reliability.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A substrate, comprising:
   a metal carrier;
   a patterned insulation layer disposed on the metal carrier and partially covering the metal carrier; and
   a patterned conductive layer disposed on the patterned insulation layer;
   wherein the metal carrier includes a cavity, a recess or a slot not extended through the metal carrier and not covered by the patterned insulation layer.

2. The substrate as claimed in claim 1, wherein the metal carrier is a lead frame comprising copper.

3. The substrate as claimed in claim 1, wherein the cavity, recess or slot is formed on the metal carrier and/or that the metal carrier includes first, second and third sections formed with a gap therebetween and connected by wire with each other and the cavity, recess or slot is formed in the second section of the metal carrier.

4. A power module package, comprising:
   a substrate including a metal carrier, a patterned insulation layer disposed on the metal carrier and partially covering the metal carrier, and a patterned conductive layer disposed on the patterned insulation layer;
   a first chip disposed on the metal carrier that includes a cavity, a recess or a slot which is not covered by the patterned insulation layer; and
   a second chip disposed on the patterned conductive layer and electrically connected to the first chip.

5. The power module package as claimed in claim 4, wherein the first chip is disposed in the cavity, the recess or the slot.

6. The power module package as claimed in claim 4, where the patterned insulation layer includes an opening, and the first chip is disposed therein.

7. The power module package as claimed in claim 4, wherein the patterned insulation layer includes a first patterned insulation portion covered by a part of the patterned conductive layer and a second patterned insulation portion, and the second chip is disposed on the part of the patterned conductive layer.

8. The power module package as claimed in claim 4, wherein the patterned insulation layer includes a first patterned insulation portion covered by a part of the patterned conductive layer and a second patterned insulation portion covered by another part of the patterned conductive layer, and the first chip is electrically connected to the another part of the patterned conductive layer.

9. The power module package as claimed in claim 4, wherein the first chip is directly connected to the metal carrier.

10. The power module package as claimed in claim 4, wherein the metal carrier is a lead frame comprising copper.

11. The power module package as claimed in claim 4, wherein the first chip is a lateral semiconductor component.

12. The power module package as claimed in claim 4, wherein the second chip is a vertical semiconductor component.

13. The power module package as claimed in claim 4, wherein the first chip has an active side with electrodes thereon and a bottom side opposite to the active side, and the first chip is disposed on the metal carrier via the bottom side.

14. The power module package as claimed in claim 4, wherein the cavity, recess or slot is formed on the metal carrier and/or that the metal carrier includes first, second and third sections formed with a gap therebetween and connected by wire with each other and the cavity, recess or slot is formed in the second section of the metal carrier.

* * * * *